United States Patent
Meesaraganda et al.

(10) Patent No.: US 11,552,771 B2
(45) Date of Patent: Jan. 10, 2023

(54) SYSTEM AND A METHOD FOR MANAGEMENT OF COMMUNICATION SUBCHANNELS IN A WIRELESS COMMUNICATION DEVICE

(71) Applicant: Morse Micro PTY. LTD, Eveleigh OT (AU)

(72) Inventors: Surendra Raju Meesaraganda, Bengaluru (IN); Krishna Prasad Kongara, Toongabbie (AU); Rama Kishore Chikkam, Surry Hills (AU)

(73) Assignee: Morse Micro PTY. LTD, Surry Hills (AU)

( * ) Notice: Subject to any disclaimer, the term of this patent is extended or adjusted under 35 U.S.C. 154(b) by 73 days.

(21) Appl. No.: 17/366,311

(22) Filed: Jul. 2, 2021

(65) Prior Publication Data

US 2022/0006596 A1 Jan. 6, 2022

(30) Foreign Application Priority Data

Jul. 3, 2020 (AU) ................ 2020902293

(51) Int. Cl.
*H04L 5/00* (2006.01)
*H04W 84/12* (2009.01)

(52) U.S. Cl.
CPC ........... *H04L 5/0092* (2013.01); *H04W 84/12* (2013.01)

(58) Field of Classification Search
CPC ... H04L 5/0092; H04L 27/16; H04L 27/2082; H04W 84/17; H04B 17/382; H04B 1/001
See application file for complete search history.

(56) References Cited

U.S. PATENT DOCUMENTS 8,184,754 B1 5/2012 Choi et al.
8,320,858 B2 * 11/2012 Ruelke ................ H04B 1/0021
455/168.1

(Continued)

FOREIGN PATENT DOCUMENTS

AU 2011247867 A1 12/2011
WO 2004054280 6/2004

OTHER PUBLICATIONS

Fang, J. et al: "Fine-Grained Channel Access in Wireless LAN". IEEE/ACM Transactions on Networking, vol. 21, No. 3, Jun. 2013, pp. 772-787.

(Continued)

*Primary Examiner* — Shukri Taha
(74) *Attorney, Agent, or Firm* — CP Law Group PC; Cy Bates

(57) ABSTRACT

A subchannel detection system for a wireless communication device is disclosed. The system includes an input interface arranged to receive digital data over a predetermined baseband having a plurality of subchannels a plurality of frequency translators arranged to shift the spectrum of the digital data within a subchannel to the center of the baseband, a plurality of low-pass filters arranged to filter frequencies in the middle of the baseband within a subchannel bandwidth, a plurality of correlators arranged to receive a filtered digital signal and correlate the received signal to a subchannel size, and a processing module arranged to receive data from the plurality of correlators and detect one or more active subchannels. The plurality of frequency translators shift the spectrum of all subchannels in the digital data to the center of the baseband; the shifted spectra are filtered by the plurality of low-pass filters and correlated to individual subchannels.

19 Claims, 13 Drawing Sheets

(56) References Cited

U.S. PATENT DOCUMENTS

| | | |
|---|---|---|
| 8,838,038 B1 | 9/2014 | Shirali et al. |
| 2006/0023812 A1* | 2/2006 | Thiagarajan ........ H04L 27/2657 |
| | | 375/326 |
| 2007/0211786 A1 | 9/2007 | Shattil |
| 2012/0129480 A1* | 5/2012 | Ruelke ................. H04B 1/0021 |
| | | 455/296 |
| 2014/0119208 A1 | 5/2014 | Hassan et al. |
| 2020/0358501 A1* | 11/2020 | Hormis .................. H04B 7/026 |
| 2022/0311457 A1* | 9/2022 | Yang ..................... H04L 5/0048 |

OTHER PUBLICATIONS

Ding, K. et al: "Active Subchannel Detection for Non-Contiguous OFDM-Based Cognitive Radio Systems", 2010 IEEE Global Telecommuncations Conference, GLOBECOM 2010, Miami, FL, USA, Dec. 6-10, 2010.

Li, J. et al: "Maximum-Likelihood Algorithm on The Subchannel Detection in Forward Links for Multicarrier DS CDMA System", IEEE International Conference on Communications, ICC 2001, IEEE, Helsinki, Finland, Jun. 11-14, 2001, pp. 2525-2529.

\* cited by examiner

SYSTEM AND A METHOD FOR MANAGEMENT OF COMMUNICATION SUBCHANNELS IN A WIRELESS COMMUNICATION DEVICE

FIELD OF THE INVENTION

The invention relates to a system and a method for management of communication subchannels in a Wireless Local Area Network (WLAN). In particular, the invention relates to identification of a subchannel being used for transmission of a data packet.

BACKGROUND

Most WLANs are based on the Institute of Electrical and Electronics Engineers (IEEE) 802.11 standard which consists of a series of half-duplex over-the-air modulation techniques that use the same basic protocol. The 802.11 protocol family employs carrier-sense multiple access (CSMA) with collision avoidance whereby equipment listens to a channel for other users (including non 802.11 users) before transmitting each packet.

WLANs generally comprise one or more access points (APs) and several connected devices or stations (STAs). An AP is a physical or a virtual device that provides access, via a wireless medium (WM), for associated STAs to another network, such as the Internet. Devices in a WLAN communicate with each via the shared WM.

The APs operate over a high bandwidth physical layer protocol data unit (PPDU). For example, common home Wi-Fi networks are based on IEEE 802.11n which defines a standard for WLAN medium access control (MAC) and physical (PHY) layers and operate on the 2.4 GHz or 5 GHz frequencies.

STAs send, receive, and/or interfere with each other on the shared WM. A STA is in-range of another STA when it can detect a transmission from the other STA directly. To address this issue, the available bandwidth is divided in several subchannels. In IEEE 802.11n, for example, the sub-band covers 80 MHz and is divided in 20 MHz or 40 MHz subchannels.

IEEE 802.11ah is another wireless networking standard that uses the 900 MHz license exempt bands to provide extended range Wi-Fi networks. It also benefits from lower energy consumption, allowing the creation of large groups of stations or sensors that cooperate to share signals, supporting the concept of the Internet of Things (IoT). Each world region supports different sub-bands, and the subchannels number depends on the starting frequency of the sub-band it belongs to. Thus, there is no global subchannels numbering plan and the subchannels numbers are incompatible between world regions (and even between sub-bands of a same world region).

In Australia, for example, 802.11ah operates in the 915 MHz-920 MHz or the 920 MHz-928 MHz sub-bands. For the 920 MHz-928 MHz sub-band, subchannels with bandwidths of 1 MHz, 2 MHz, 4 MHz or 8 MHz are available.

Each Wi-Fi STA can receive signals across the entire allocated energy spectrum (8 MHz for the 802.11ah in Australia) and must be able to detect which subchannel is being used by the AP for each incoming data packet. To do so, existing Wi-Fi STAs use dedicated banks of band-pass filters and correlators that test available subchannels simultaneously. This approach requires a complex set of hardware which needs to be powered and controlled by the PHY layer processor(s) and takes space on the Wi-Fi silicon integrated circuit used by the AP.

SUMMARY

To help with dividing up airtime between available channels, 802.11ah introduces the terminology primary and secondary (or, more formally, non-primary) channels. The primary channel is the channel used to transmit something at its native bandwidth. For each channel bandwidth, there is one primary channel, meaning that it is the channel used to transmit frames at that channel width.

By selecting the channel bandwidth to be used on a per-frame basis, 802.11ah can more efficiently use the available spectrum. When a wide channel is available, high data rates are possible. When only a narrow channel is available, communication can fall back to lower rates.

Aspects of the present invention allow detecting the subchannel being used by the AP using reduced hardware resources and therefore a reduced power budget. The available subchannels can be managed using a set of low complexity low-pass filter banks and frequency translators, instead of the banks of specifically tuned band-pass filters used in current Wi-Fi STAs.

In accordance with the first aspect, the present invention comprises, a subchannel detection system for a wireless communication device, the system comprising: an input interface configured to receive digital data over a predetermined baseband; the baseband being divided into a plurality of subchannels; a plurality of frequency translators, each translator configured to shift spectrum of the digital data within a subchannel to a center of the baseband; a plurality of low-pass filters; each low-pass filter configured to filter frequencies within a subchannel bandwidth; a plurality of correlators; each correlator configured to receive a filtered digital signal and correlate the received digital signal to a subchannel size; and a processing module configured to receive data from the plurality of correlators and detect one or more active subchannels; wherein the plurality of frequency translators shift spectrum of all subchannels in the digital data received by the input interface to the center of the baseband; the shifted spectra are filtered by the plurality of low-pass filters and correlated by the plurality of correlators to individual subchannels.

In embodiments, the baseband spreads between −4 MHz and +4 MHz and the digital data is a digital representation of a modulated analog signal received by a receiving station connected to a wireless network.

In embodiments, the plurality of subchannels comprises a bandwidth of 1 MHz, 2 MHz, 4 MHz or 8 MHz.

In embodiments, the plurality of frequency translators comprises frequency translator banks, wherein each frequency translator bank is configured to shift the spectrum of the subchannel with a predetermined bandwidth to the center of the baseband.

In embodiments, the plurality of frequency translator banks comprises a first bank of eight frequency translators arranged to shift subchannels with a bandwidth of 1 MHz, a second bank of four frequency translators arranged to shift subchannels with a bandwidth of 2 MHz and a third bank of two frequency translators arranged to shift subchannels with a bandwidth of 4 MHz.

In embodiments, each of the plurality of frequency translators comprises a phase shifter.

In embodiments, the plurality of low-pass filters comprises a plurality of Finite Input Response Filters (FIRs).

In embodiments, each subchannel comprises one FIR and each FIR comprises a digital decimator configured to halve a number of samples in the received digital signal.

In embodiments, the plurality of FIRs comprises minimum phase filters.

In embodiments, each of the plurality of correlators is configured to correlate the received signal to the subchannel bandwidth.

In embodiments, the system further comprises a plurality of digital delay modules, each digital delay module being associated with one of the plurality of subchannels and being configured to delay a subchannel signal to synchronize the plurality of subchannels.

In embodiments, wherein the plurality of frequency translators comprises mixers arranged to multiply incoming sequence of samples by sequences of [1, −1] or [j, −j].

In embodiments, wherein the plurality of low-pass filters comprises polyphase components $H_e(z^{-2})$ and $z^{-1}H_e(z^{-2})$ where $H_e(z)$ and $H_o(z)$ are even and odd polyphase components of each of the plurality of the low-pass filters.

In accordance with the second aspect, the present invention comprises, a method for subchannel detection for a wireless communication device embedding a subchannel detection system in accordance with the first aspect; the method comprising: receiving digital data over the predetermined frequency baseband at the input interface; the baseband being divided into the plurality of subchannels; shifting the spectrum of the received digital data from a band of the plurality of subchannels to the center of the baseband via one or more of the plurality of frequency translators; filtering frequencies within each subchannel band via the plurality of low-pass filters; correlating each filtered digital signal to a respective subchannel using the plurality of correlators; and detecting the one or more active subchannels by analysing data received from the plurality of correlators via the processing module.

In embodiments, further comprising: delaying an output of one or more of the plurality of correlators to synchronize the output of each of the plurality of correlators.

In embodiments, wherein the step of shifting the spectrum of the received digital data further comprises splitting samples of the digital data based on whether each of the samples occupies an even position or an odd position in a sequence of samples and directing samples to different mixers based on whether the samples are odd samples or even samples.

In embodiments, further comprising: multiplying even samples with [1] or [−1] and odd samples with [j] or [−j].

In embodiments, wherein the step of filtering frequencies within each subchannel band via the plurality of low-pass filters further comprises using low-pass filters $H_{LP}(z)$ which comprise polyphase components $H_e(z^{-2})$ and $z^{-1}H_o(z^{-2})$ configured to filter rotated odd and even sequences; wherein $H_e(z)$ and $H_o(z)$ are even and odd polyphase components of the low pass filter, $H_{LP}(z)$.

In accordance with the third aspect, the present invention comprises, a wireless local area network (WLAN) station (STA) comprising: an analog receiving module configured to receive a signal encoding modulated data over a predetermined sub-band; a mixer including a filter configured to shift the received signal to a baseband; an analog-to-digital converter arranged to convert the signal in the baseband to a digital signal and store the digital signal in a memory; a subchannel detection system comprising: an input interface configured to receive digital data over a predetermined baseband; the baseband being divided into a plurality of subchannels, a plurality of frequency translators, each translator configured to shift spectrum of the digital data within a subchannel to a center of the baseband; a plurality of low-pass filters; each low-pass filter configured to filter frequencies within a subchannel bandwidth. a plurality of correlators; each correlator configured to receive a filtered digital signal and correlate the received digital signal to a subchannel size, and a processing module configured to receive data from the plurality of correlators and detect one or more active subchannels, wherein the plurality of frequency translators shift spectrum of all subchannels in the digital data received by the input interface to the center of the baseband; the shifted spectra are filtered by the plurality of low-pass filters and correlated by the plurality of correlators to individual subchannels; and a data decoding module arranged to decode the modulated data based on active subchannel information received from the subchannel detection system.

Advantages of embodiments of the invention allow reducing the complexity of the digital filtering hardware used to identify the active subchannels. The frequency translation step allows using banks of digital low-pass filters, instead of band-pass filters, reducing hardware and power requirements. This configuration also allows for the use of minimum phase FIR filters, reducing the issue of desynchronization between subchannels with a different bandwidth. Furthermore, the low-pass FIRs and half-band filters, which have half of their coefficient equal to zero, allow for reduction in memory size due to simplified filter banks. In addition, the banks of correlators can be run at a much lower frequency, having therefore a reduced power requirement.

DETAILED DESCRIPTION

Figure 1A:
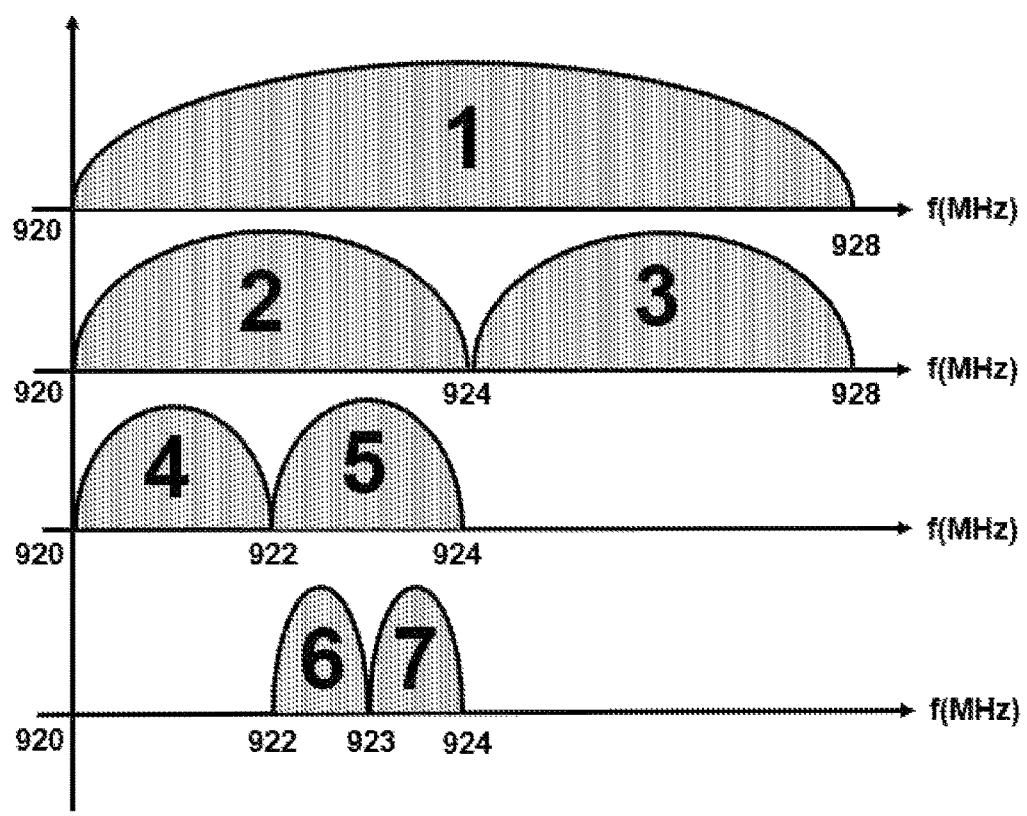
FIG. 1A shows illustrations of digital signals encoded in different available subchannels in one of the Australian IEEE 802.11ah sub-bands.

For purposes of explanation and not limitation, details and descriptions of certain preferred embodiments are hereinafter provided such that one having ordinary skill in the art may be enabled to make and use the invention. These details and descriptions are representative only of certain preferred embodiments, however, a myriad of other embodiments which will not be expressly described will be readily understood by one having skill in the art upon a thorough review of the instant disclosure. Accordingly, any reviewer of the instant disclosure should interpret the scope of the invention only by the claims, as such scope is not intended to be limited by the embodiments described and illustrated herein.

For purposes herein, the term "sub-band" means a predetermined frequency space used to transmit and receive over a wireless medium. For example, in the present disclosure the subband is 920 MHz to 928 MHz.

The term "baseband" means a frequency space around a zero frequency (DC).

The term "subchannel" means a portion of spectrum in the sub-band that is used for transmission of an amount of data in a period of time.

The term "frequency translator" means a module used to shift frequency spectrum of a signal by a predetermined frequency offset. The frequency translator may comprise a configuration of transistors and/or other components appreciated by one having skill in the art which is configured to shift the frequency spectrum of the signal.

The term "phase shifter" means a module used to shift a phase of a signal by a predetermined phase offset. The phase shifter may comprise a configuration of transistors and/or other components appreciated by one having skill in the art which is configured to shift the phase of the signal by the predetermined phase offset.

The term "correlator" means a module that calculates the correlation (similarity) between two input signals and provides an output proportional to such correlation. The correlator may comprise a configuration of transistors and/or other components appreciated by one having skill in the art which is configured to calculate the correlation between two input signal and provide an output proportional to said correlation.

Wireless Local Area Networks (WLANs) operate over predetermined frequency sub-bands. WLANs communication protocols are generally based on standards set out by the Institute of Electrical and Electronics Engineers (IEEE).

For example, home Wi-Fi networks are generally based on the IEEE 802.11n, which defines a standard for WLAN medium access control (MAC) and physical (PHY) layers and operates on the 2.4 GHz or 5 GHz frequencies. IEEE 802.11ah, instead, uses the 900 MHz license exempt bands to provide extended range Wi-Fi networks to cater for IoT applications.

STAs send, receive, and/or interfere with each other on the shared WM. A STA is in-range of another STA when it can detect a transmission from the other STA directly. Channel interference can be originated by nearby Wi-Fi networks or other radio signals on the WM.

To address channel interference problems, the available sub-band is generally divided in several subchannels that the Access Point (AP) can manage while communicating with different receiving stations (STAs). For example, 802.11n allows for 20 MHz or 40 MHz wide subchannels in an 80 MHz sub-band. 802.11ah, instead, allows for subchannels with different bandwidths. However, each world region supports different sub-bands, and the subchannels number depends on the starting frequency of the sub-band it belongs to. Thus, there is no global subchannels numbering plan and the subchannels numbers are incompatible between world regions (and even between sub-bands of a same world region).

In this disclosure, the 802.11ah standard, and the 920 MHz-928 MHz sub-band used in Australia, will be used as an example. However, it is understood that the systems and methods described can be used for any WLAN system that manages several subchannels in a given sub-band, such as 802.11ah with a broader sub-band (for example in the US where a 16 MHz main channel is available to 802.11ah), 802.11n or others. The 920 MHz-928 MHz Australian sub-band is divided in subchannels with bandwidths of 1 MHz, 2 MHz, 4 MHz or 8 MHz. The sub-band can accommodate 8×1 MHz channels, 4×2 MHz channels, 2×4 MHz channels or 1×8 MHz channels.

FIG. 1A shows an example of primary subchannels encoded on the 920 MHz-928 MHz Australian 802.11ah sub-band. For each packet, the AP can test the WM to check how much of the sub-band is available. If the entire 8 MHz bandwidth is available, the AP can encode a packet on the entire 8 MHz subchannel (1) using an available digital modulation technique (BSK, QPSK or QAM). If a portion of subchannel (1) is not available, for example due to interference from another 802.11ah network, the AP can downsize to the 4 MHz channels. The AP halves the current channel (1) and selects the half with less interference. In this case the AP can select the Low 4 MHz channel (2) the High 4 MHz channel (3).

The selected subchannel will become the primary subchannel and the subchannel with the interference will be regarded as secondary subchannel for the transmission of the current packet. If further interference is detected on the primary, the AP halves the primary again and falls back to 2 MHz subchannels (4 or 5). If, in turn, the selected 2 MHz subchannel is not interference free, the AP can further divide by two and select a 1 MHz subchannel (6 or 7) to encode the current packet.

Using a subchannel with a wider bandwidth for transmission allows for a faster transmission rate of a specific packet. Importantly, being able to use smaller subchannels allows for simultaneous use of the secondary subchannel by another AP or STA nearby and therefore efficient use of the available sub-band.

The receiving STAs on the network, which can be full stack receivers or simpler sensors, are generally configured to listen for incoming signals on the entire sub-band. STAs may have no awareness of which sub-band is being used by the AP to transmit a specific packet and therefore must implement subchannel detection techniques for each packet received. In some cases, the STAs are aware of the primary channel configuration that has been used by the AP to transmit the latest packets received by the STA, namely the specific pairs of primary channels being used for each subchannel type (4 MHz, 2 MHz, 1 MHz).

Figure 2:
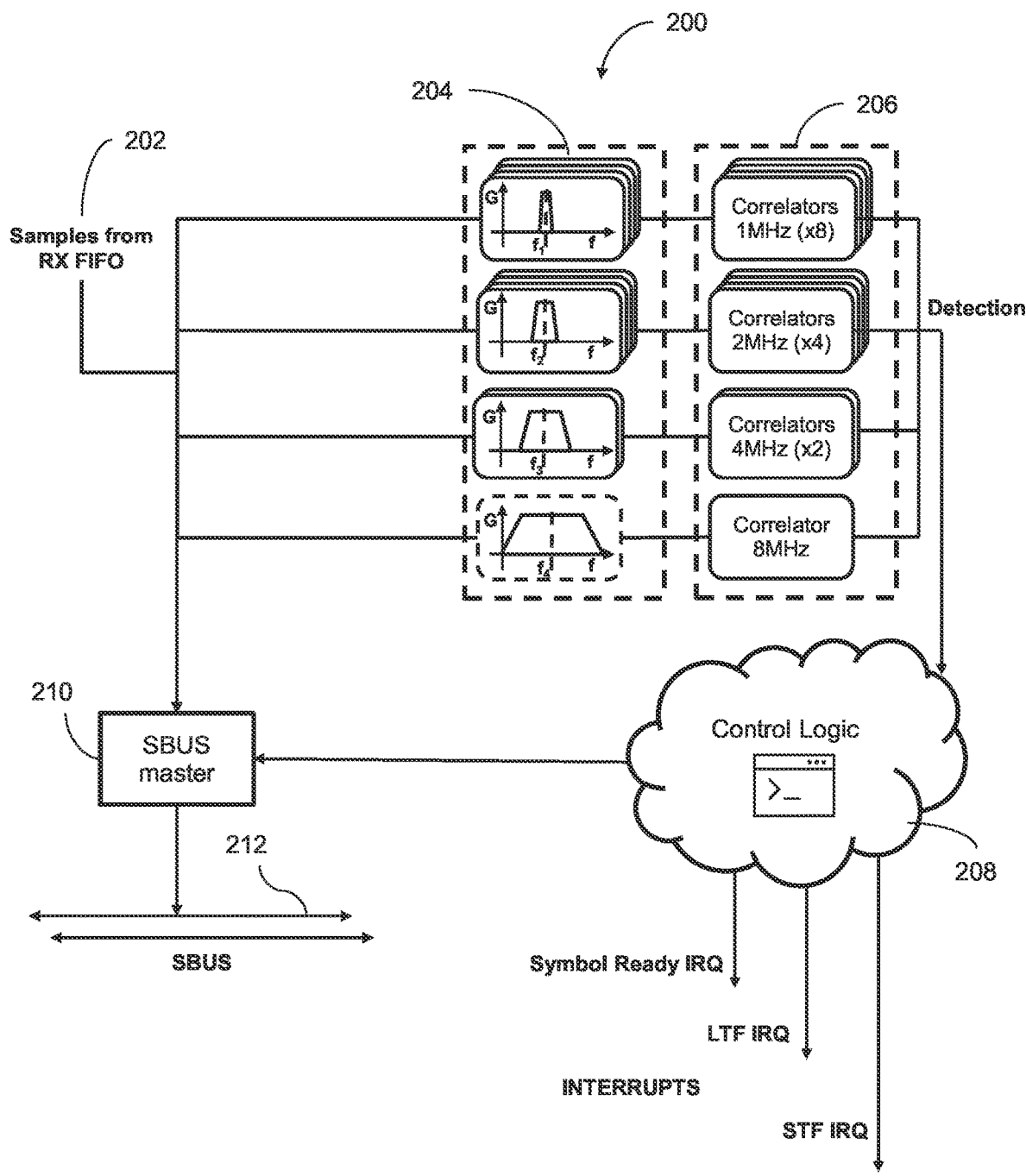
FIG. 2 is a block diagram of a system for detecting an active subchannel by a wireless communication device on a wireless local area network (WLAN) as known in the art.

FIG. 2 is a schematic illustration of a system 200 for detecting an active subchannel in a wireless sub-band in accordance with the prior art. The signal travelling over the WM is received by the analog receiving module of the STA, which comprises the STA antenna. The received baseband analog signal is converted to the required sub-band by mixing with a tone frequency in the middle of the sub-band and filtered using low-pass filters, in line with the expressions below.

$R_{bb}(t)$ Received baseband signal at operating bandwidth.
$S_{bb}(t)=LPF\{R_{bb}(t)\exp(-j2\pi f_{sb}t)\}$ Sub-band obtained by mixing the baseband signal with the required frequency followed by low pass filtering.

The baseband signal is, in turn, converted into a digital signal using an analog-to-digital converter (ADC) and stored in a RX FIFO memory structure 202. In order to decode a packet correctly, the system must identify the relevant subchannel used by the AP to send the packet. To do so, the subchannel detection system retrieves the digital signal from the RX FIFO memory 202 and filters the signal using band-pass Finite Input Response (FIR) filters 204. Each filter is tuned to match one of the subchannels available in the sub-band.

In particular, for the 920 MHz-928 MHz sub-band, the subchannel detection system can comprise eight 1 MHz band-pass filters, respectively centered around 0.5 MHz, 1.5 MHz, 2.5 MHz, 3.5 MHz, −0.5 MHz, −1.5 MHz, −2.5 MHz, −3.5 MHz; four 2 MHz band-pass filters, respectively centered around 1 MHz, 3 MHz, −1 MHz and −2 MHz; two band-pass filters, respectively centered around 2 MHz and −2 MHz; one 8 MHz band-pass filter (channel filter) filtering frequencies between −4 MHz and 4 MHz.

The digital output of each filter is sent to a correlator 206 that correlates the filtered signal to a specific subchannel bandwidth. The output of each correlator is proportional to the correlation of the filtered signal to the specific bandwidth. Each correlator output is directed to a control logic 208 hosted on the physical layer (PHY) of the receiving station or sensor. The control logic determines which subchannel is transmitting relevant information for each received packet by comparing the output of all the correlators with a series of predetermined thresholds. This information is communicated to the STA data decoders, through the SBUS master 210 and shared platform bus 212. The data decoding modules have access to the same digital RX FIFO and can decode the signal in accordance with the specific subchannel information.

Subchannel detection is generally completed over a number of bits of a PHY packet preamble so that the decoding module can decode the relevant portion of the PHY packet with the correct subchannel information.

The banks of FIR bandpass filters of system 200 require computational and hardware resources on-chip, such as memory capacity. In addition, the power used by the banks of correlators is proportional to the clock frequency used, which corresponds to the mid-subchannel frequency for each correlator.

Figure 3:
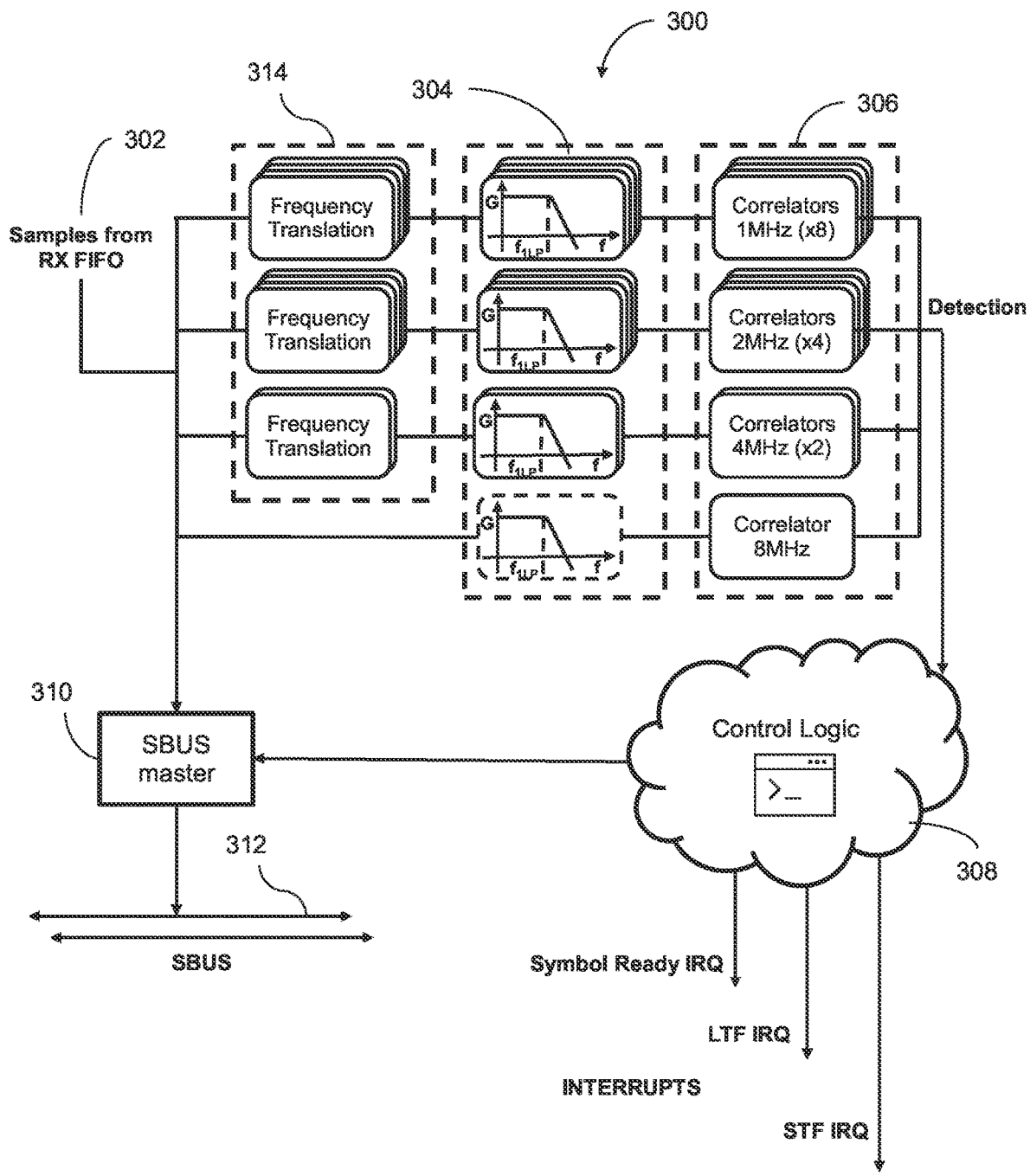
FIG. 3 is a block diagram of a system for detecting an active subchannel by a wireless communication device on a wireless local area network (WLAN) which uses banks of low-pass filters, in accordance with embodiments.

FIG. 3 is a schematic illustration of a system 300 for detecting an active subchannel in the baseband in accordance with embodiments. In system 300, the digital signal retrieved from the RX FIFO 302 is sent to a series of frequency translators 314 that shift the portions of the spectrum relative to each subchannel to the center of the baseband. Once the spectrum is shifted to the center of the baseband, the signal can be provided to low-pass filters 304. Substantially identical low-pass filters 304 can be used for each subchannel size, therefore significantly reducing the complexity of the overall architecture. In this example, the system requires eight low-pass filters with a 500 KHz cutoff frequency, four low-pass filters with a 1 MHz cutoff frequency, two low-pass filters with a 2 MHz cutoff frequency and one optional channel filter with a 4 MHz cutoff frequency.

The filtered signals can be sent to subchannel correlators, which operate based on the same principle described above with reference to FIG. 2.

The hardware and computational requirements of the system 300 of FIG. 3 are substantially improved over the system of FIG. 2 due to the replacement of the digital FIR band-pass filters with the combination of frequency translators 314 and low-pass filters 304. The low-pass filters can be implemented, using less memory and have lower computational complexity.

Figure 4:
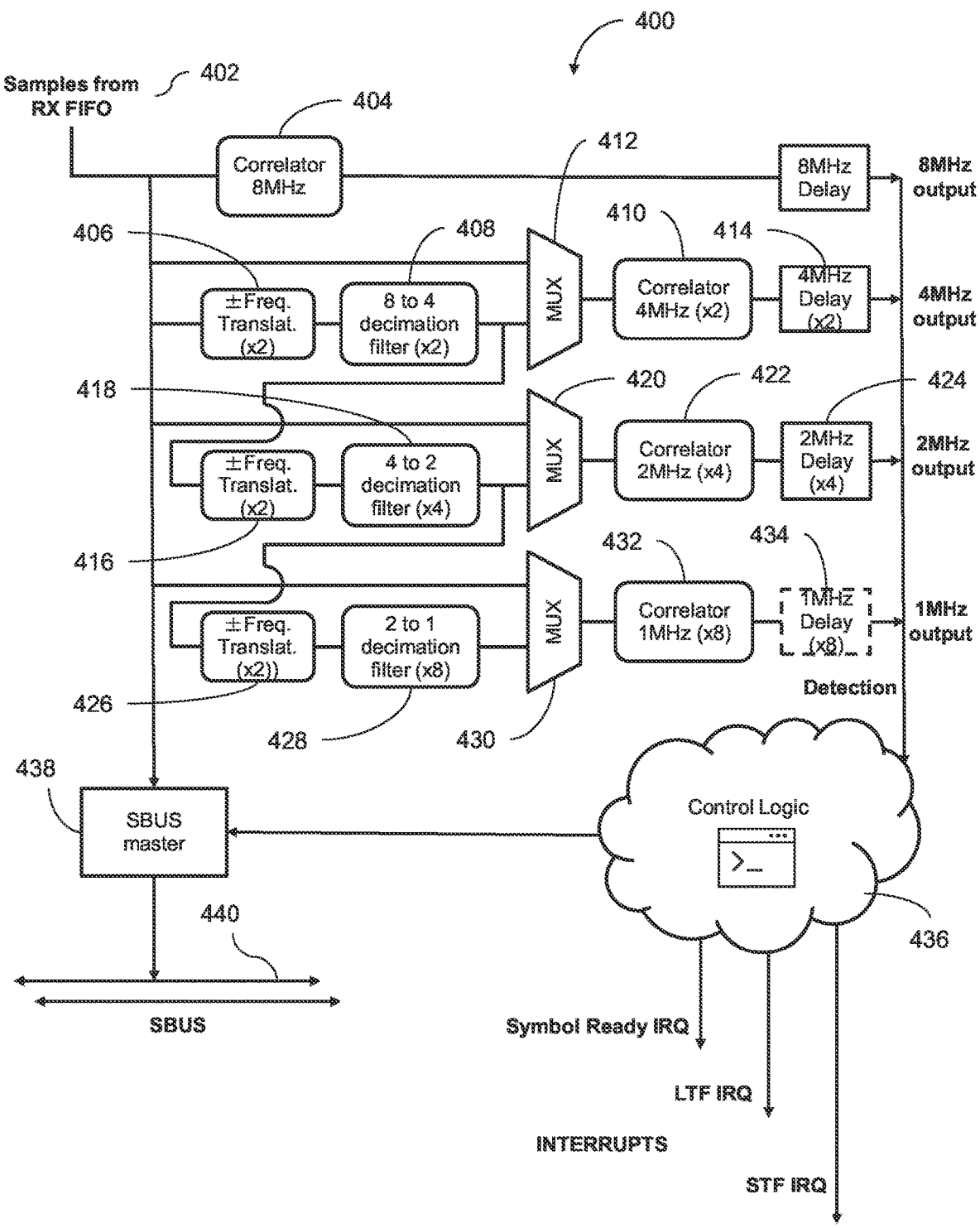
FIG. 4 is a block diagram of a system for detecting an active subchannel by a wireless communication device on a wireless local area network (WLAN) which uses cascading branches of frequencies translators and decimation filters, in accordance with embodiments.

The systems shown in FIG. 3 and FIG. 4 include enough modules to detect all available subchannels simultaneously. This allows detecting the active subchannel (primary) and, at the same time, gathering information on the subchannels that are not being used by the AP (secondary), for example indication of interference on the secondary channel. Such information could depict the state of the WM at the STA location and could be sent to other modules in the STA via bus 440 and ultimately relayed back to the AP.

Figure 5:
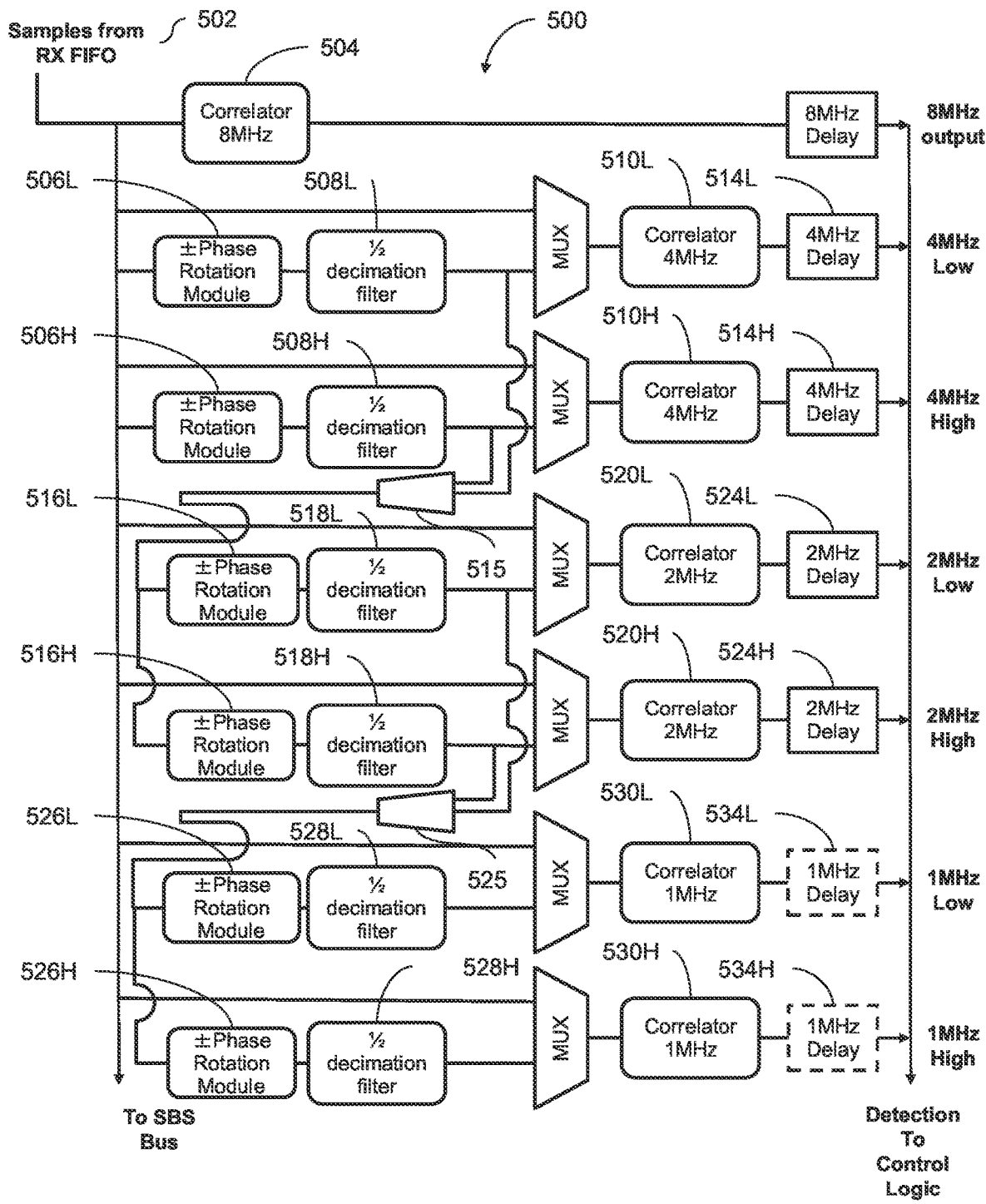
FIG. 5 is a block diagram of a system for detecting an active subchannel by a wireless communication device which implements the scheme shown in FIG. 4.

A system that uses a minimised set of phase rotators, decimation filters and correlators is shown with reference to FIG. 5. FIG. 8 to FIG. 11 also show signals in the relevant subchannel during the frequency translation and filtering stages.

The system 400 of FIG. 4 implements the schematic diagram of FIG. 3. In the system 400 of FIG. 4 the 8 MHz channel, the 2×4 MHz channels, the 4×2 MHz channels and 8×1 MHz channels are organised in a cascaded configuration.

The digital signal 402 is sent to an 8 MHz correlator 404 directly to test the main 8 MHz subchannel and, simultaneously, to two phase rotation modules 406 which perform a series of digital phase rotations of either ±900 or 0° and 180°. Such phase rotations are equivalent to shifting the signal in the two 4 MHz subchannels by 2 MHz towards the left (4 MHz High) and 2 MHz towards the right (4 MHz Low) to the center of the baseband.

The output of the phase rotation modules 406 is sent to respective decimators 408 that filter and downsample the signals by halving the number of samples (8 to 4 samples) and therefore perform as low-pass filters filtering the 4 MHz Low and 4 MHz High subchannels. The use of decimators as digital low-pass filters is enabled by the subchannel frequency shift to the center of the baseband.

The output of each of the two decimators 408 is sent to a respective correlator 410 through a multiplex 412. The multiplex 412 allows bypassing the frequency shift and filtering steps if required. The correlators calculate a correlation between the signal and the 4 MHz bands.

A time delay is introduced each time the signal is sent through a decimator; therefore, the correlators outputs are all delayed by a predetermined number of samples using delay stages 414 to synchronize all outputs.

The output of each of the two decimators 408 is sent to another pair of phase rotation modules 416 (total of four phase rotation modules 416). A first pair of phase rotation modules 416 respectively perform a series of digital phase rotations of the shifted and decimated 4 MHz Low subchannel. A second pair of phase rotation modules 416 respectively perform a series of phase rotations of shifted and decimated 4 MHz High subchannel. The result of these rotations provides all the 2 MHz subchannels bands shifted to the center of the baseband. The frequency shift is stored in a memory for each shifted subchannel. The phase rotations are performed by multiplying the samples in the frequency domain by a sequence that is a repetition of [1, −j, −1, j] or [1, j, −1, −j], producing phase rotations of 0°, +/−90° and +/−180°.

The output of the phase rotation modules 416 is sent to respective decimators 418 that downsample the signals by halving the number of samples (4 to 2 samples) and therefore perform digital low-pass filtering.

The output of each of the four decimators 418 is sent, through multiplex 420, to a bank of four correlators 422 that calculate a correlation between the signal and the 2 MHz bands.

Four delay stages 424 synchronize the 2 MHz correlators outputs by considering the delay introduced by the two decimation steps (408 and 418).

In order to test the eight 1 MHz subchannels, the output of each of the four decimators 418 is sent to a pair of phase rotation modules 426. In the embodiment of FIG. 4, a total of eight 1 MHz phase rotation modules 426 is used. Each of the eight phase rotation modules 426 performs a sequence of digital phase rotations of one of the shifted and decimated 2 MHz subchannels. The result of these rotations provides all the 1 MHz subchannels bands shifted to the center of the baseband. The frequency shift is stored in a memory for each shifted subchannel. In alternative embodiments, as discussed below with reference to FIGS. 6 and 7, the number of phase rotations and phase rotations module can be reduced, and one series of rotations can be used to obtain both upper and lower sub-bands.

The output of the phase rotation modules 426 is sent to respective decimators 428 that downsample the signals by halving the number of samples (2 to 1 samples) and therefore perform digital low-pass filtering.

The output of each of the eight decimators 428 is sent, through multiplex 430, to a bank of eight correlators 432 that calculate a correlation between the signal and the 1 MHz bands.

Eight delay stages 434 synchronize the 1 MHz correlators outputs by considering the delay introduced by the three decimation steps (408, 418 and 428). The 1 MHz subchannels experience the most amount of delay through the subchannel detection process and therefore the delay stages 434 in this case are optional. In some embodiments, all other subchannels can be synchronized to the 1 MHz subchannels with appropriate delays and the eight delay stages 434 for the 1 MHz subchannels can be avoided. In this case the 1 MHz subchannels have no delay; the 2 MHz subchannels are delayed by (N/2−1) samples; the 4 MHz subchannels are delayed by (N−2) samples and the 8 MHz subchannel is delayed by (2N−4) samples using conventional FIR low-pass filters. The delay modules can be implemented using shift registers that are clocked differently depending on the respective subchannel bandwidth.

In some instances, the low-pass FIR decimators may be implemented using minimum phase filters. An advantage of this type of filter is that it introduces a significantly reduced delay, a disadvantage is related to the phase distortion introduced. However, the application of such filters in the system 400 of FIG. 4 is not sensitive to such phase distortions as the correlators 306 are not sensitive to phase, allowing for faster operation of the system. The opportunity to use minimum phase FIR filters is another advantage provided by embodiments of the present invention.

The output from all correlators is proportional to the correlation of the filtered signal to a specific subchannel bandwidth. Each correlator output is directed to a control logic 436 which determines which subchannel is being used by the access point to transmit a data packet. This information is communicated to the STA data decoders, through the SBUS master 438 and shared platform bus 440. The data decoding modules have access to the same digital RX FIFO and can decode the signal in accordance with the specific subchannel information.

Importantly, the system 400 of FIG. 4 allows for the use of several decimators, which are all like each other, in cooperation with the ±90° phase rotation modules and correlators to simultaneously perform subchannel detection.

Decimators are less complex to implement and operate than the FIR band-pass filters used in the current subchannel detection systems and can only be used as low-pass filters.

The system of FIG. 4 allows using similar phase rotation modules decimators and correlators for each type of subchannel. For example, in order to test the two 4 MHz subchannels two similar phase rotators with opposite signs are used together with two identical FIR decimators filters that halve the sample number and two identical correlators. The FIR decimation filters use different filtering coefficients based on the size of the subchannel being detected and the correlators have different correlation detection thresholds for different types of subchannels.

Figure 1B:
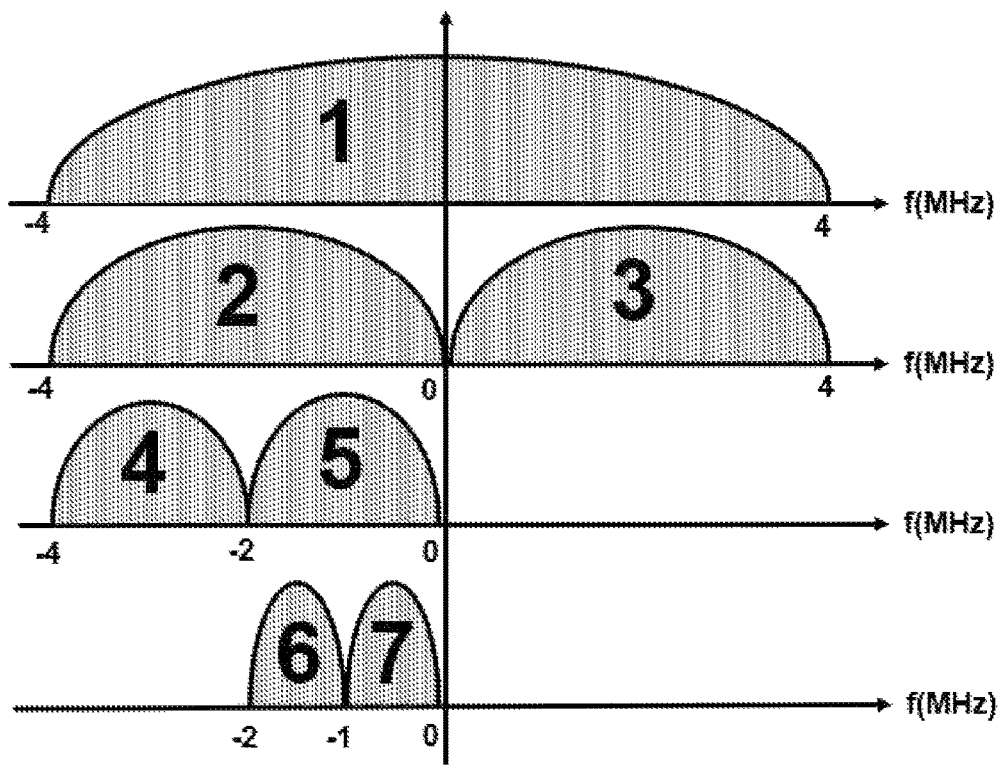
FIG. 1B shows illustrations of digital signals encoded in different available subchannels translated to the baseband.

As discussed, the system 400 of FIG. 4 includes a full set of modules to detect all available primary and secondary subchannels. The embodiment shown in FIG. 5, instead, implements the functionalities discussed with reference to FIG. 3 using a minimised set of phase rotators, FIR decimation filters and correlators. As discussed above with reference to FIG. 1, in current Wi-Fi protocols the available subchannel is split in two halves each time the AP recognizes that full use of the subchannel is not possible, for example due to interference.

The system 500 of FIG. 5 employs a pair of frequency translators, FIR dedication filters, correlators, and delay modules for the 4 MHz, 2 MHz and 1 MHz subchannels respectively. An additional correlator and delay module are used for the 8 MHz subchannel. The system 500 allows detecting an active subchannel on a predetermined subchannel map, such as the one shown in FIG. 1, and is based on previous communication with the AP. The system tests the 8 MHz main channel, one 4 MHz subchannel (High or Low) and two subchannels for the 2 MHz and 1 MHz bands. The schematic of FIG. 5 shows all the components required for subchannel detection organised on High (positive rotation) and Low (negative rotation).

Figure 6A:
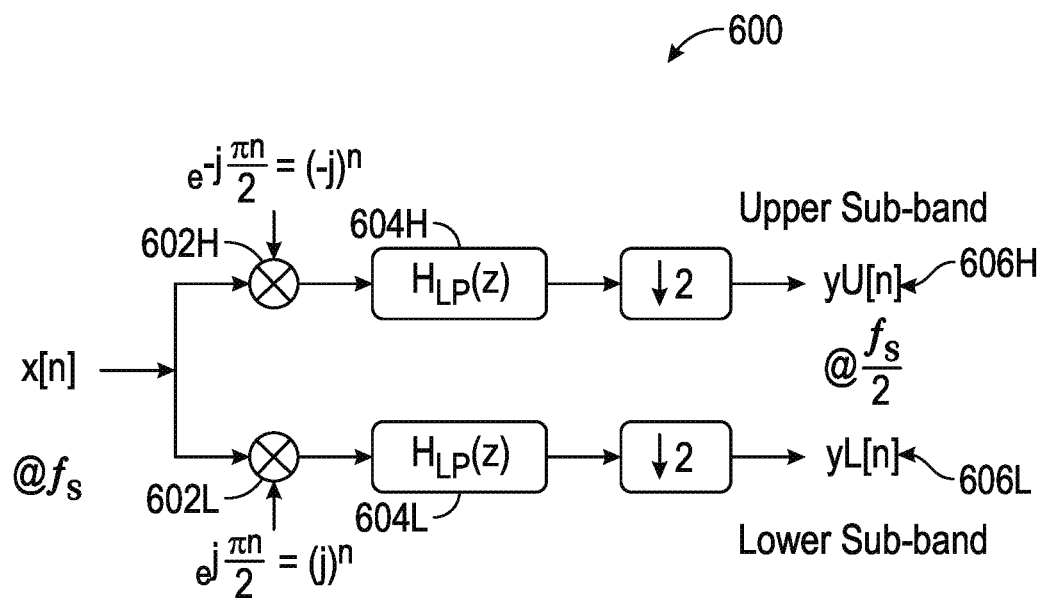
FIG. 6A shows a schematic block diagram of a system for detecting an active subchannel by a wireless communication device on a wireless local area network (WLAN), in accordance with embodiments.

The digital signal 502 is sent to an 8 MHz correlator 504 directly to test the main 8 MHz subchannel. FIG. 6A shows a schematic representation of the 8 MHz signal and FIG. 5B shows the output of the 8 MHz correlator in case of an active 8 MHz subchannel.

Figure 9A:
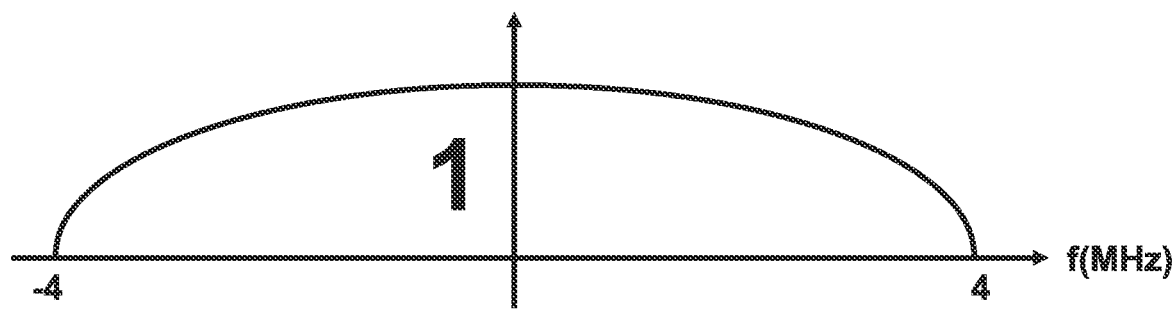
FIG. 9A shows an illustration of the 8 MHz subchannel in the baseband.
Figure 9B:
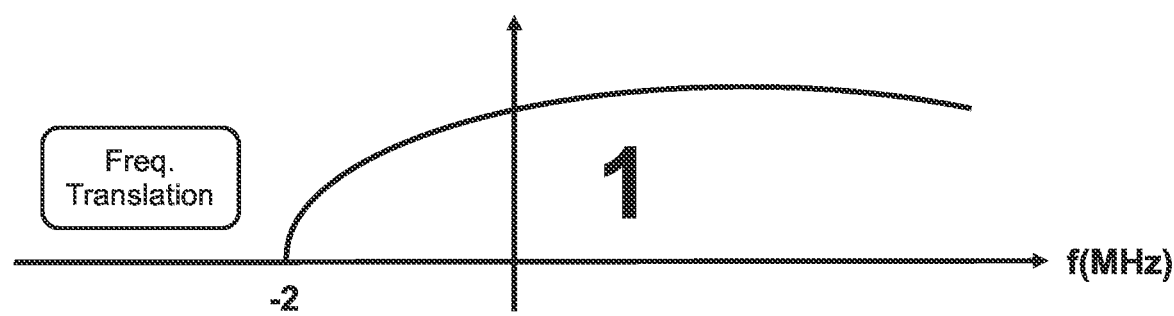
FIG. 9B shows the 8 MHz subchannel shifted to the right by 2 MHz.
Figure 9C:
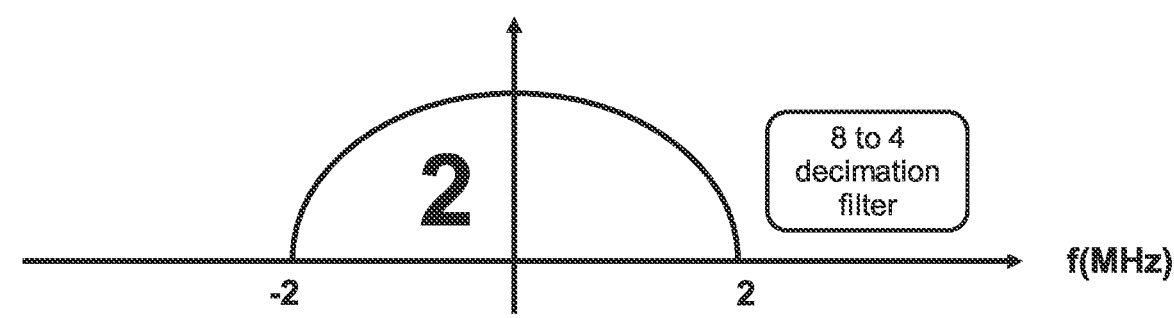
FIG. 9C shows spectrum of FIG. 9B filtered by a low-pass filter with a 2 MHz cut-off frequency to extract one of the 4 MHz subchannels.

The digital signal 502 is simultaneously sent to two phase rotation modules 506L, 506H which perform a digital phase rotations. Such phase rotations are equivalent to shifting the 8 MHz signal by 2 MHz towards the left (4 MHz High) and 2 MHz towards the right (4 MHz Low). FIG. 9A shows the centered 8 MHz subchannel and FIG. 9B shows the same spectrum shifted by 2 MHz to the right to center on the 4 MHz Low subchannel (2). The frequency shift is stored in a memory for each shifted subchannel.

The output of the phase rotation modules 506L is sent to a respective decimator 508L that downsamples the signal by halving the number of samples (8 to 4 samples) and therefore perform as low-pass filtering the 4 MHz Low. The result of the decimation step for subchannel 2 is shown schematically in FIG. 9C.

Figure 9D:
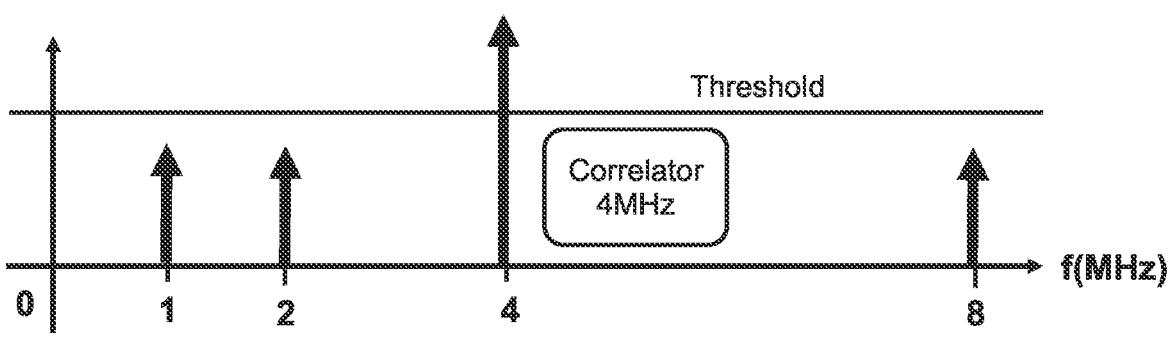
FIG. 9D shows an illustration of the system's correlators output when a 4 MHz subchannel is detected as the active subchannel.

The output of each of the two decimators 508L is sent to a respective correlator 510L through a multiplex. The correlator 510L calculates a correlation between the signal and the 4 MHz band. FIG. 9D shows the output of the correlator 510L if channel 2 is found active.

Finally, the correlator output is sent to a time delay module 514L to synchronize with the output of the 1 MHz correlators (534).

A similar process takes place to test the 4 MHz High subchannel (3) using phase rotator module 506H, filter 508H, correlator 510H and delay stage 514H.

Both outputs from the two decimation filters 508L, 508H are directed to a selection module 515 that selects which channel to forward and halve to for the 2 MHz subchannels. The selection is performed based on previous data packets exchanged with the AP. As discussed above, the AP tests the sub-band to decide which subchannel configuration to use for each packet. If a packet is delivered successfully to the STA and acknowledged, the current subchannel configuration can be used for the next packet and the selection module 515 can be set accordingly.

If channel 2 (4 MHz Low) is forwarded to phase rotator modules 516L, 516H, the 2 MHz channels 4 and 5 can be tested in line with a similar process as described for the 4 MHz subchannels 2 and 3.

Subchannel 4 is tested using phase rotator module 516L, filter 518L, correlator 520L and delay stage 524L. Subchannel 5 is tested using phase rotator module 516H, filter 518H, correlator 520H and delay stage 524H.

Figure 10A:
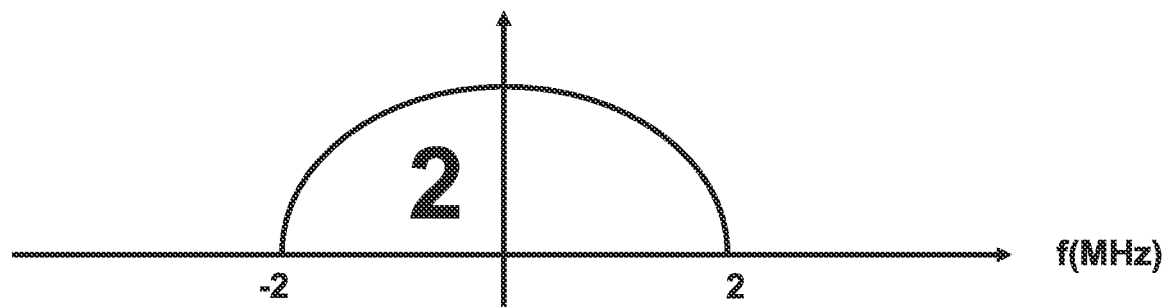
FIG. 10A shows an illustration of a 4 MHz subchannel in the baseband.
Figure 10B:
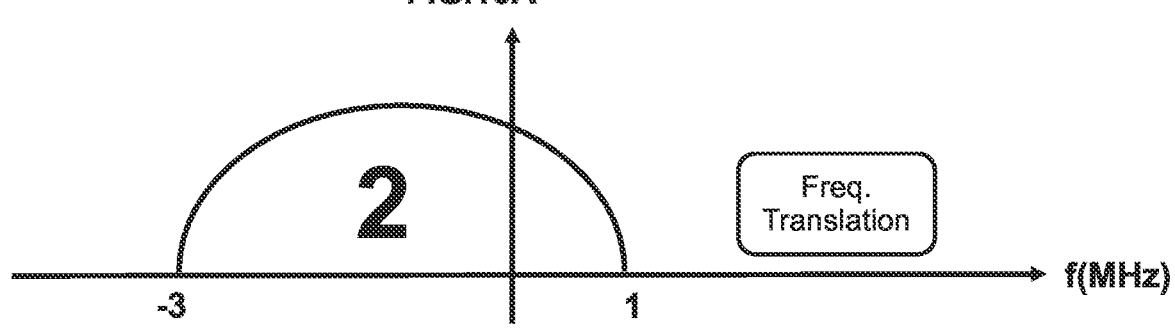
FIG. 10B shows the 4 MHz subchannel of FIG. 10A shifted to the left by 1 MHz.
Figure 10C:
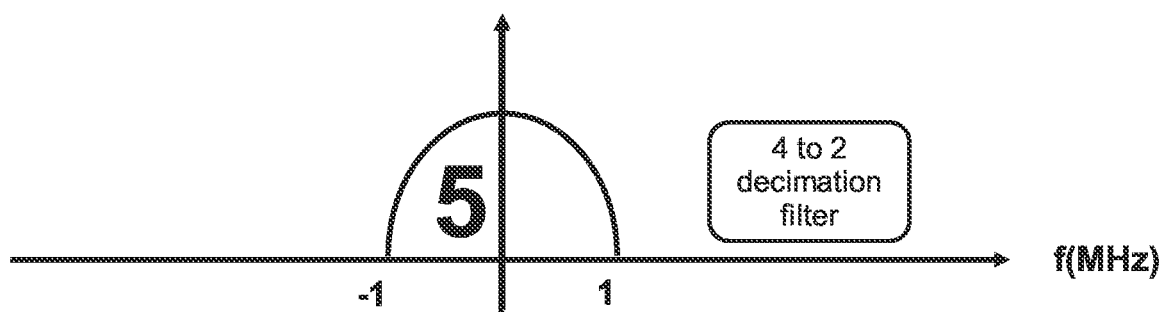
FIG. 10C shows spectrum of FIG. 10B filtered by a low-pass filter with a 1 MHz cut-off frequency to extract one of the 2 MHz subchannels.
Figure 10D:
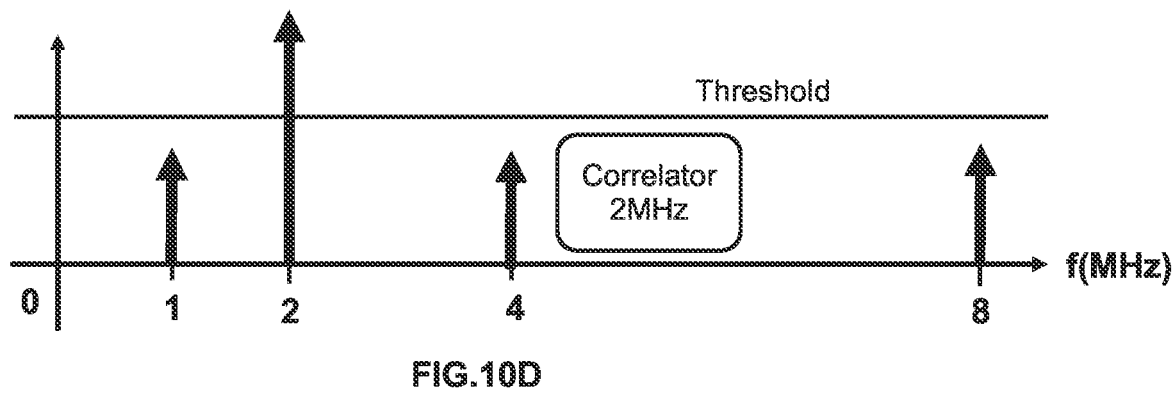
FIG. 10D shows an illustration of the system's correlators output when a 2 MHz subchannel is detected as the active subchannel.

FIG. 10A shows the centered 4 MHz subchannel 2. FIG. 10B shows the same spectrum shifted by 1 MHz to the left to center on the 2 MHz High subchannel (5). The frequency shift is stored in a memory for each shifted subchannel. The result of the decimation step for subchannel 5 is shown schematically in FIG. 8C. FIG. 10D shows the output of the correlator 520H if channel 5 is found active.

Both outputs from the two decimation filters 518L, 518H are directed to a selection module 525 that selects which channel to forward and halve to form the two 1 MHz subchannels. The selection is performed based on previous data packets exchanged with the AP. As discussed above, the AP tests the sub-band to decide which subchannel configuration to use for each packet. If a packet is delivered successfully to the STA and acknowledged, the current subchannel configuration can be used for the next packet and the selection module 525 can be set accordingly.

If channel 5 (2 MHz High) is forwarded to the frequency translation modules 526H the 2 MHz channels 6 and 7 can be tested in line with a similar process as described for the 2 MHz subchannels 4 and 5.

Subchannel 6 is tested using phase rotator module 526L, filter 528L, correlator 530L and delay stage 534L. Subchannel 7 is tested using frequency translator 526H, filter 528H, correlator 530H and delay stage 534H.

For an 8 MHz operating channel bandwidth scenario, there could be 15 different possibilities of primary channels on which information could be received. The receiver needs to detect the primary channel on which information is being received and typically looks for a known sequence called the short training field (STF) in the beginning of the packet and applies cross-correlation and auto-correlation techniques, as the ones described above, to guess where the primary channel may be.

It is understood that the efficiency of this process and the amount of hardware required are important parameters for the performance of the receiver, both in terms of throughput and power consumption.

All the available subchannels can be tested by a sequence of division by half, as discussed above. This can be achieved by $f_S/4$ mixing followed by 2-to-1 decimation, where $f_S$ is the size of the sub-band. The $f_S$ mixing is equivalent to multiplying the incoming samples by $(-j)^n$ or $(j)^n$ respectively. The sequence $(-j)^n$ is a repetition of the basic sequence $[1, -j, -1, j]$, while the sequence $(j)^n$ is a repetition of the basic sequence $[1, j, -1, -j]$. Therefore, the $f_S/4$ mixing operation can be performed as a multiplication of the original subchannel sequence, $x[n]$ with $(-j)^n$ or $(j)^n$ respectively.

FIG. 6A shows a general schematic 600 of a module that divides a subchannel of size $f_S$ into an upper and a lower portion of size $f_S/2$ centered in the middle of the baseband. The frequency translation is achieved by mixers 602H, 602L for the higher and lower portion of the subchannel. The shifted spectra are filtered and decimated using similar low-pass filters $H_{LP}(z)$ 604H, 604L to provide the two upper 606H and lower subchannels 606L.

Figure 6B:
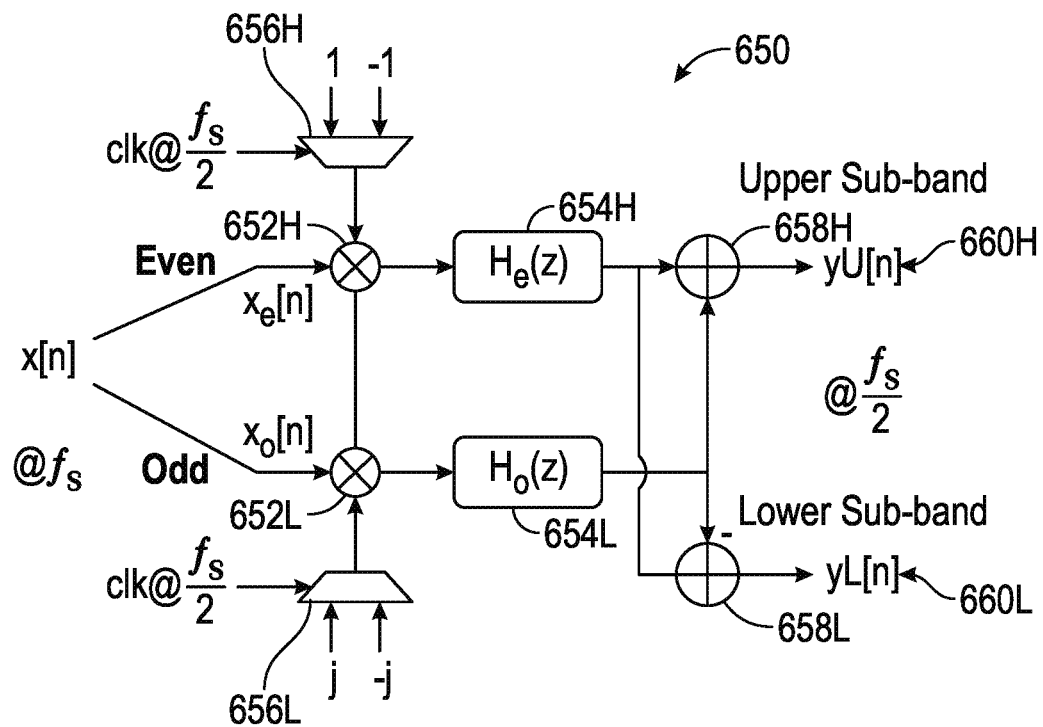
FIG. 6B shows a schematic block diagram of a system for detecting an active subchannel by a wireless communication device on a wireless local area network (WLAN) which improves hardware requirements.

FIG. 6B shows a schematic 650 of a module that divides a subchannel of size $f_S$ into an upper and a lower portion of size $f_S/2$ centered in the middle of the baseband in accordance with one embodiment. This embodiment leverages the sequence multiplication technique to perform the frequency mixing and phase rotation and reduce the amount of hardware required by cleverly managing the sample sequences.

The incoming samples in the subchannel of size $f_S$ are split and directed to different mixers based on whether they are odd samples or even samples. Even samples are directed towards a mixer 652H which performs multiplication with a sequence of $[1, -1]$ at $f_S/2$, basically inverting the phase (180° phase rotation) of every second incoming sample; odd samples are directed towards a mixer 652L which performs multiplication with a sequence of [j, −j] at $f_S/2$, basically rotating by ±90° every second incoming sample.

The rotated odd and even sequences are filtered using polyphase components of the original low-pass filter $H_{LP}(z)$ such that:

$$H_{LP}(z)=H_e(z^{-2})+z^{-1}H_o(z^{-2})$$

where $H_e(z)$ and $H_o(z)$ are the even and odd polyphase components of the low pass filter, $H_{LP}(z)$. The upper and lower subchannel 660H, 660L can be reconstructed by respectively adding or subtracting the two sequences in simple adder modules 658H, 658L.

The above polyphase decomposition of the low-pass filter and the fact that the multiplication of the subchannels sequence by a phase rotation sequence allow to design the very efficient architecture of the entire subchannel detection. The circuit of FIG. 6B can be deployed in the architecture shown in FIG. 5 providing advantages in terms of hardware required and power consumption.

Since, the detection of the primary channel needs to be fast, the low pass filters should be designed to minimize latency while still maintaining its passband and stopband specifications. Low delay minimum phase filters are a good choice since they offer the lowest latencies, although with a tradeoff for non-linear phase response. In some embodiments, half-band filters are deployed to provide low complexity and tolerable delay. FIR half-band filters, for example, have an impulse response has every other filter coefficient being zero. A consequent advantage of using FIR half-band filters is that the polyphase components have advantageous properties. The even component, $H_e(z)$ has only one non-zero component while the odd component $H_o(z)$ has symmetric coefficients. These properties can be exploited for a low complexity implementation.

In alternative embodiments, infinite-impulse-response (IIR) half-band low pass and high pass filters can be implemented using two all-pass sections.

$$H_\alpha(z) = \frac{\alpha + z^{-2}}{1 + \alpha z^{-2}}$$

and $$H_\beta(z) = \frac{\beta + z^{-2}}{1 + \beta z^{-2}}$$

where the parameters α and β are real numbers.

The transfer function of an IIR Half-band low-pass filter, $H_{IIR\text{-}HB}$ (z) can be formed from the above all pass section as:

$$H_{IIR\text{-}HB}(z)=H_\alpha(z^{-2})+z^{-1}H_\beta(z^{-2})$$

Figure 7A:
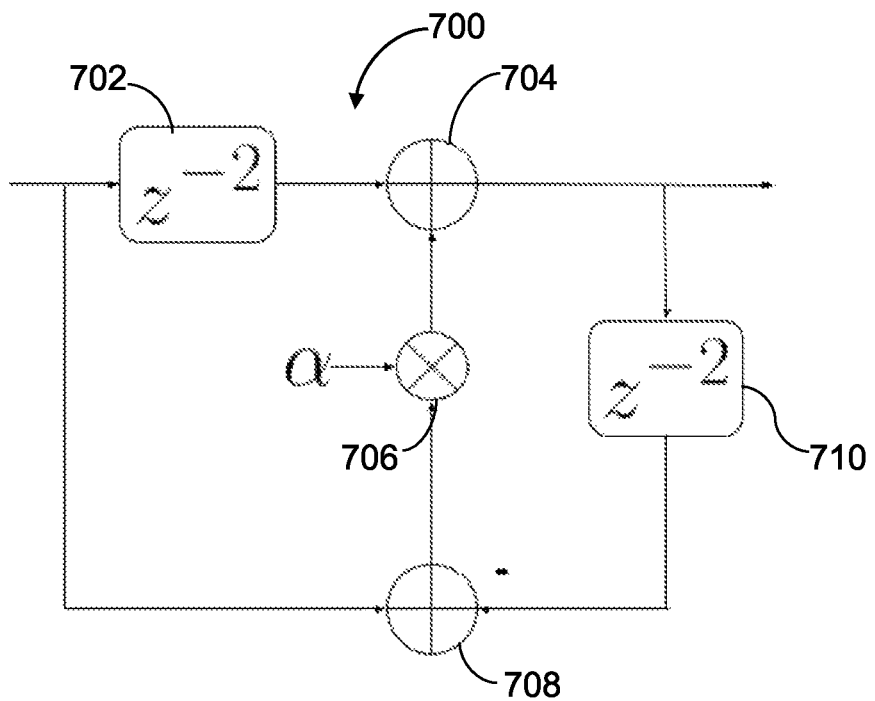
FIGS. 7A and 7B are block diagrams of all-pass filter modules that may be used for the implementation of the system in FIG. 6B.

FIG. 7A shows a block diagram of the component all-pass filters $H_\alpha(z^{-2})$ 700. The filter comprises two delay modules 702, 710 which provide a two samples delay; two adder/subtract modules and a multiplier module 706 which allows choosing the parameter α so that the attenuation characteristics of the filter can be controlled.

Figure 7B:
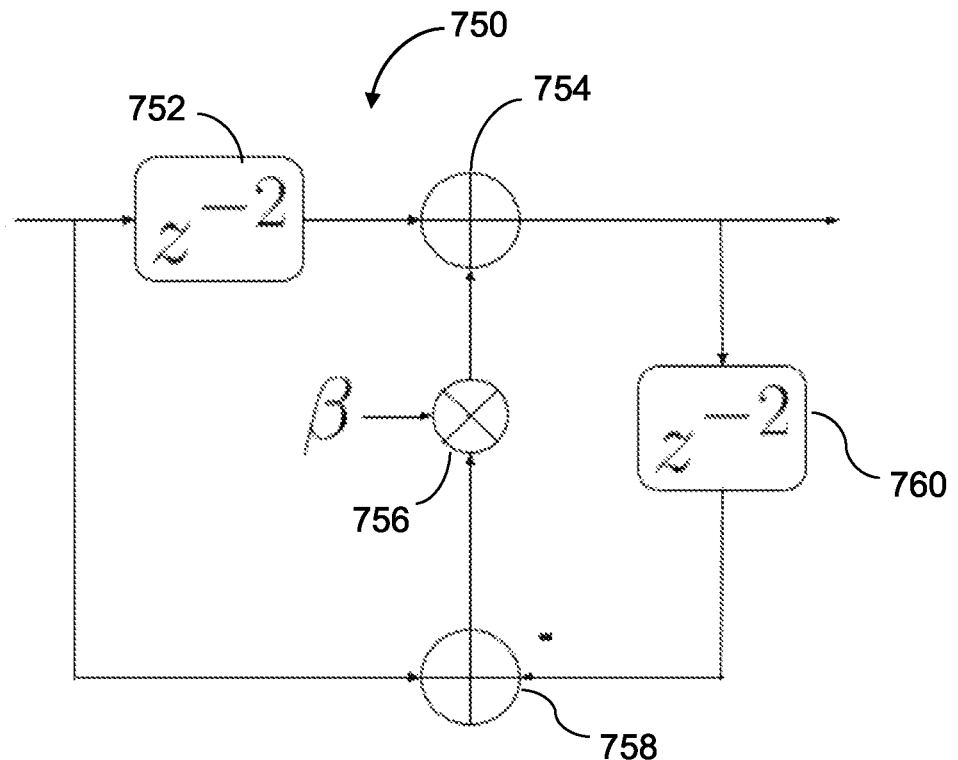
Figure 7C:
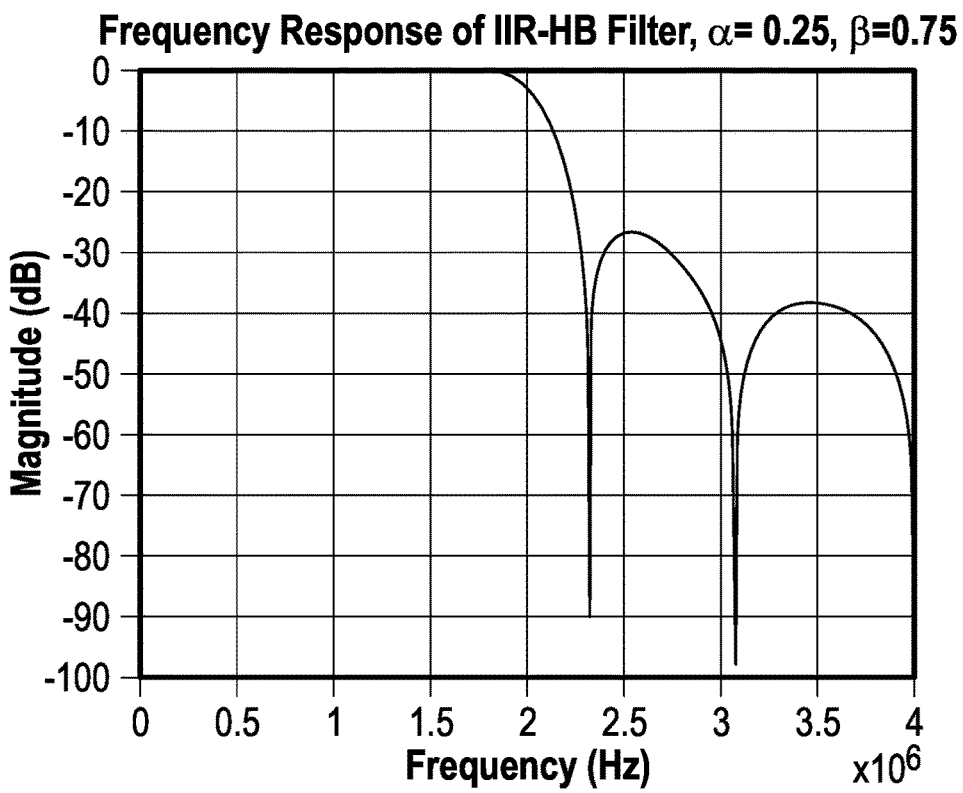
FIG. 7C and FIG. 7D respectively show the frequency response group delay response of a IIR half-band are schematic block diagrams of systems for detecting an active subchannel by a wireless communication device on a wireless local area network (WLAN) in accordance with embodiments.
Figure 7D:
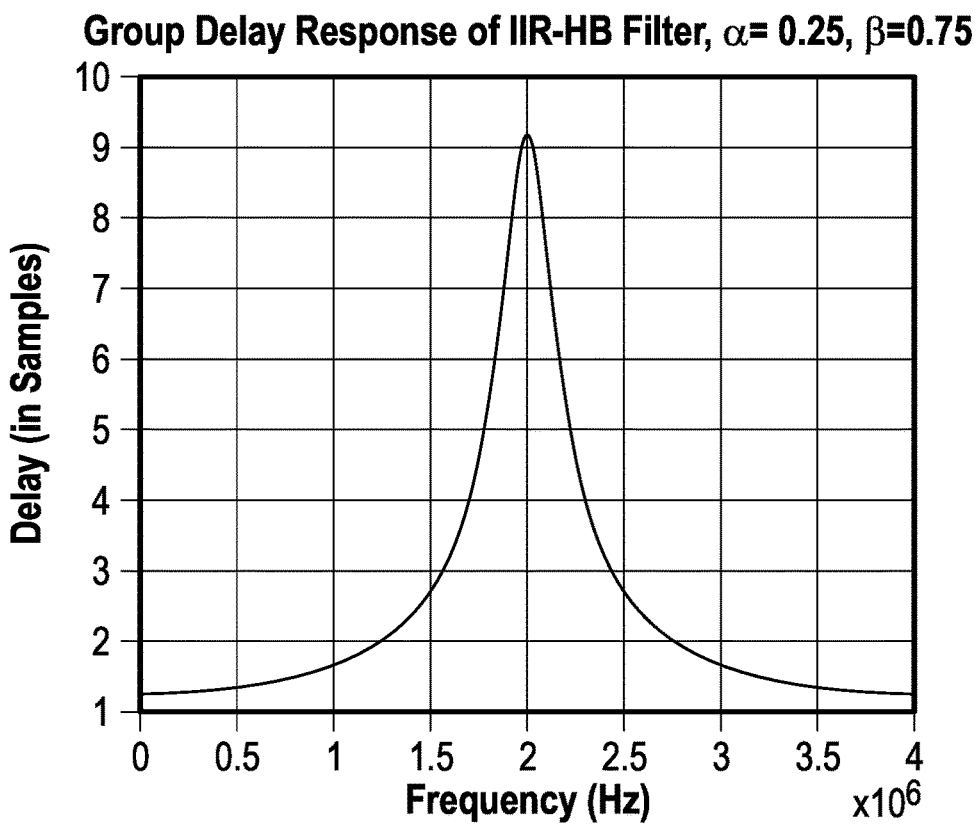

FIG. 7B shows a block diagram of the component all-pass filters $H_\beta(z^{-2})$ 700. The filter comprises two delay modules 752, 760 which provide a two samples delay; two adder/subtract modules and a multiplier module 756 which allows choosing the parameter β so that the attenuation characteristics of the filter can be controlled.

Since the IIR HB filters use only one multiplier, the complexity of IIR Half-band filters is low. Though not a linear phase filter, the group delay of the IIR Half-band filter is low in the pass-band, as shown in the example depicted in FIG. 7C and FIG. 7D. The above characteristics make it an attractive choice of filters for the sub-band generation.

FIG. 8 to 11 show schematic illustrations of signals in some of the subchannels at different stages of the system of FIG. 5.

Figure 8A:
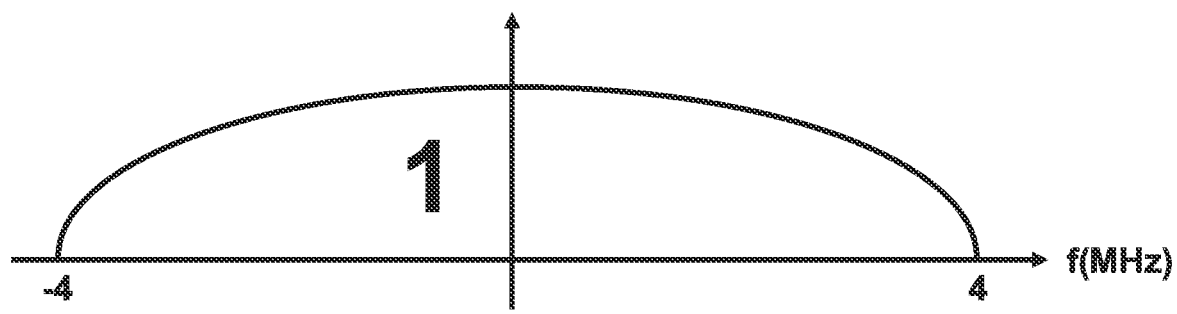
FIG. 8A shows an illustration of the 8 MHz subchannel in the baseband.
Figure 8B:
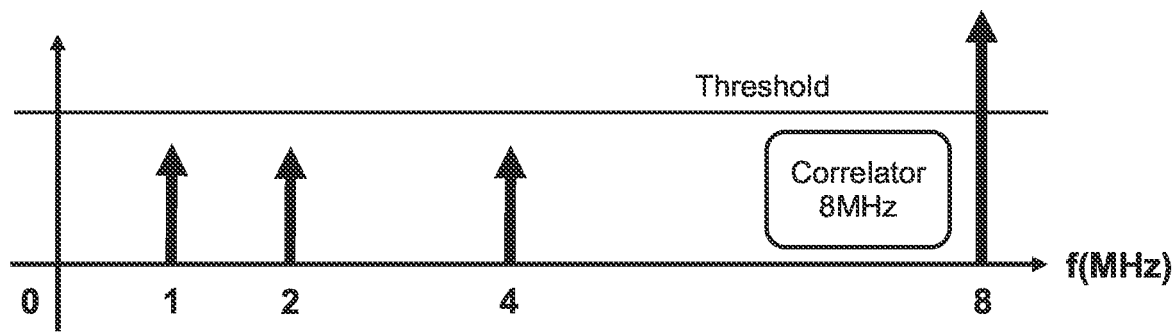
FIG. 8B shows an illustration of the system's correlators output when the of 8 MHz subchannel is detected as the active subchannel.

FIG. 8A shows the centered 8 MHz subchannel 1. FIG. 8B shows the output of the correlator if channel 1 is found active.

FIG. 9A shows the centered 8 MHz subchannel 1. FIG. 9B shows the same spectrum shifted by 2 MHz to the right to center on the 4 MHz Low subchannel 2. The frequency shift is stored in a memory for each shifted subchannel. The result of the decimation step for subchannel 2 is shown schematically in FIG. 9C. FIG. 9D shows the output of the correlator if channel 2 is found active.

FIG. 10A shows the centered 4 MHz subchannel 2. FIG. 10B shows the same spectrum shifted by 1 MHz to the left to center on the 2 MHz High subchannel 5. The result of the decimation step for subchannel 5 is shown schematically in FIG. 10C. FIG. 10D shows the output of the correlator 530H if channel 5 is found active.

Figure 11A:
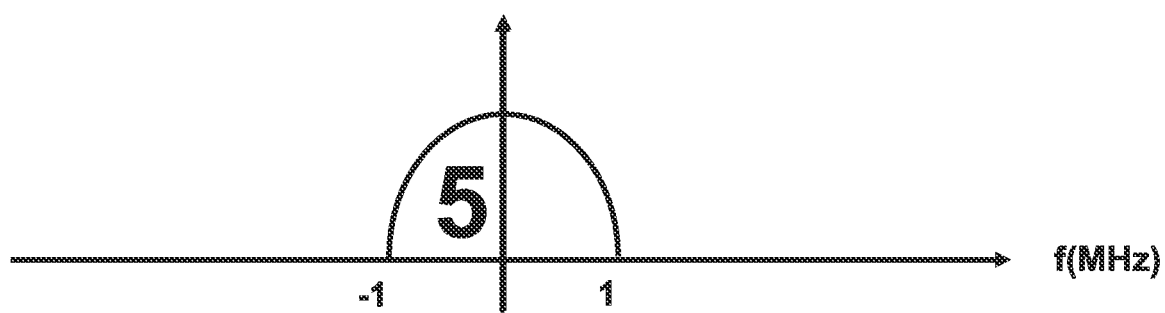
FIG. 11A shows an illustration of a 2 MHz subchannel in the baseband.
Figure 11B:
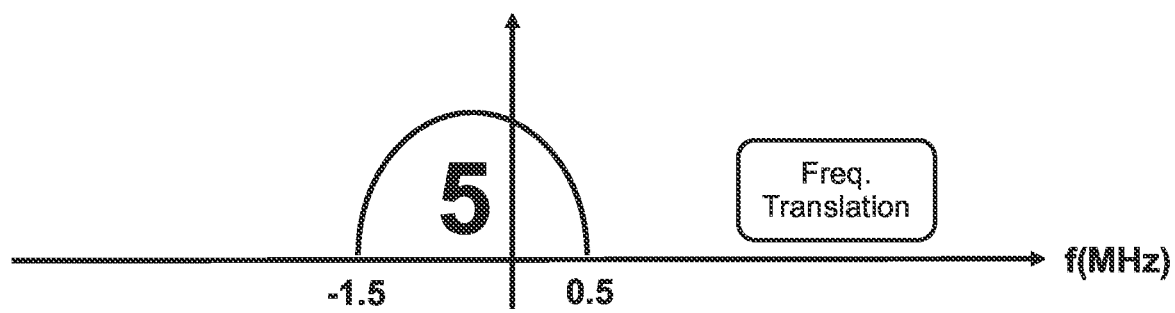
FIG. 11B shows the 2 MHz subchannel of FIG. 11A shifted to the left by 0.5 MHz.
Figure 11C:
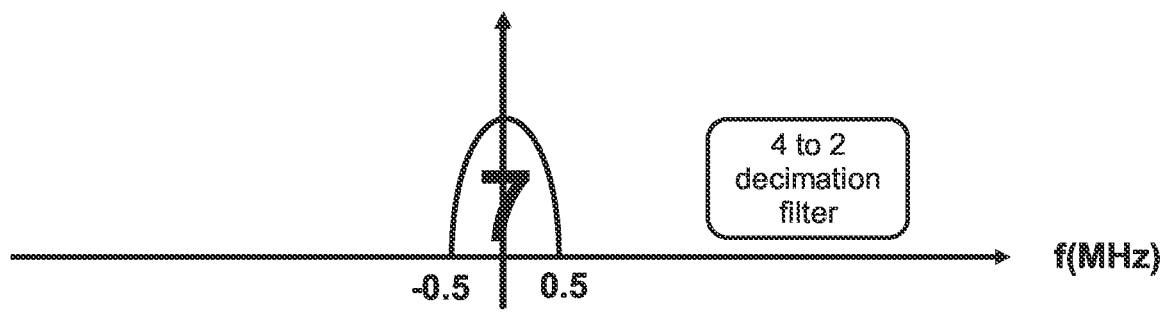
FIG. 11C shows the spectrum of FIG. 11B filtered by a low-pass filter with a 0.5 MHz cut-off frequency to extract one of the 1 MHz subchannels.
Figure 11D:
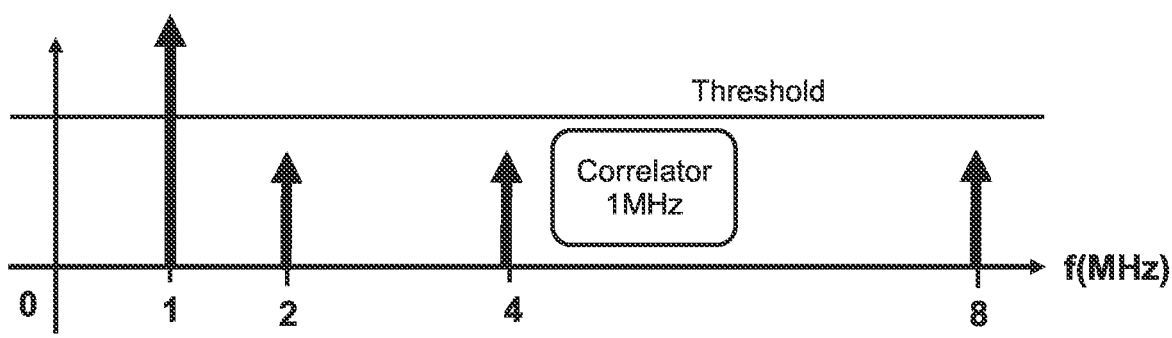
FIG. 11D shows an illustration of the system's correlators output when a 1 MHz subchannel is detected as the active subchannel.

FIG. 11A shows the centered 2 MHz subchannel 5. FIG. 11B shows the same spectrum shifted by 0.5 MHz to the left to center on the 1 MHz High subchannel (7). The result of the decimation step for subchannel 7 is shown schematically in FIG. 11C. FIG. 111D shows the output of the correlator 530H if channel 7 is found active.

Figure 12:
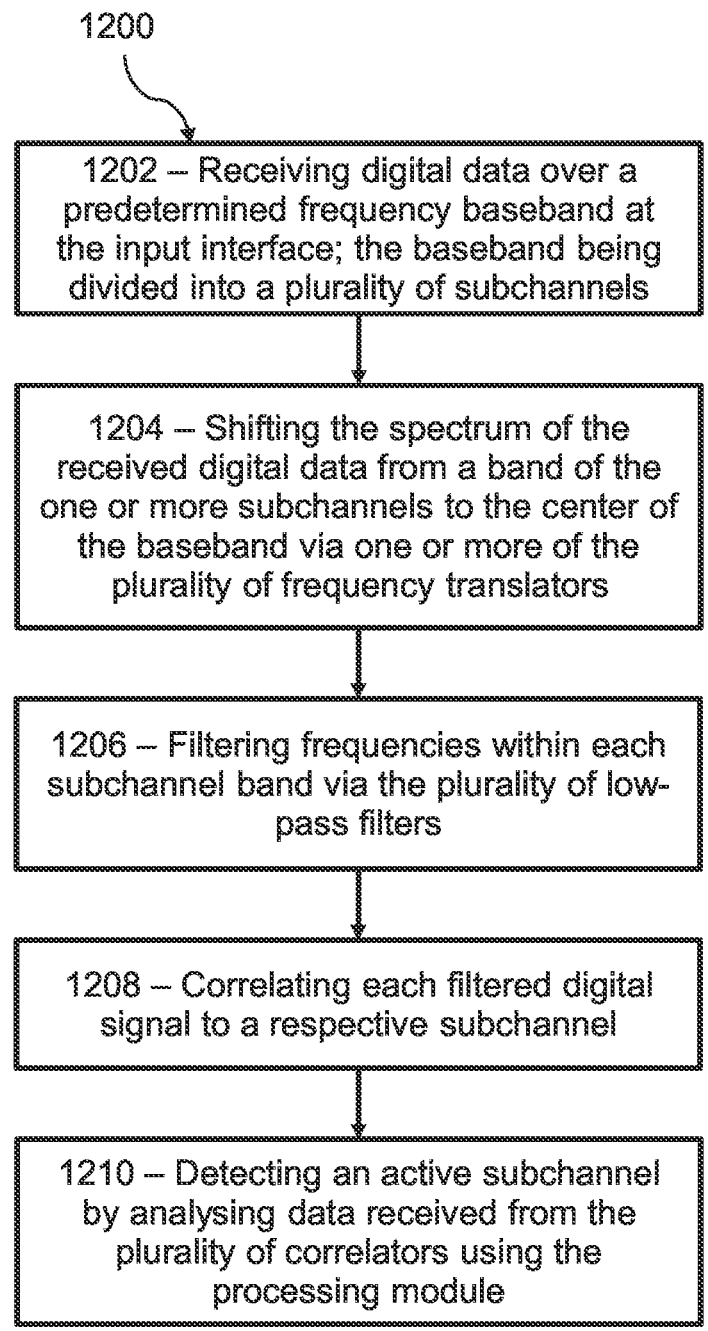
FIG. 12 is a flow diagram outlining method steps performed to detect an active subchannel for a wireless communication device in accordance with embodiments.

FIG. 12 is a flow diagram 1200 outlining method steps performed to detect an active subchannel for a wireless communication device in accordance with embodiments. Firstly, digital data over a predetermined frequency baseband is received at the input interface (1202). The baseband is divided into a plurality of subchannels. The spectrum of the received digital data is shifted from a band of the one or more subchannels to the center of the baseband via one or more of the plurality of frequency translators (1204). The shifted spectrum is filtered within each subchannel band via the plurality of low-pass filters (1206). Each filtered digital signal is correlated to a respective subchannel using the plurality of correlators (1208). Finally, the active subchannel is detected by analysing data received from the plurality of correlators via the processing module.

In some instances, the method also comprises the step of delaying an output of one or more correlators to synchronize the output of all correlators and storing each phase shift required for each subchannel in order for the processing module to calculate which subchannel is active.

The subchannel detection system described with reference to FIGS. 1 to 12 is suitable to be deployed in a wireless local area network (WLAN) station (STA) to perform subchannel detection when the STA receives a data packet. The STA has an analog receiving module configured to receive an analog signal which encodes that that can be modulated using several modulation techniques and coding schemes.

The data is transmitted over the wireless medium from another STA or an access point within a frequency sub-band and, generally, over a frequency subchannel within the sub-band. The received analog signal is mixed with another signal in a similar frequency range and, therefore, its spectrum shifted to the baseband. An analog-to-digital converter is used within the STA to digitize the received signals. The digital samples are generally stored in a memory location. The initial digital samples are directed to the subchannel detection system that allows detecting which subchannel is being used by the transmitting station to transmit a packet within the allowed subband. In the instance of an IEEE 802.11 based protocol, these initial samples generally cover at least a portion of the short training field (STF) of a packet.

Once the active subchannel is detected by the subchannel detection system, the data being transmitted over the subchannel a data decoding module arranged to decode the modulated data based on active subchannel information received from the subchannel detection system.

It is to be understood that the above description is illustrative of the invention and is not to be construed as limiting the invention. Various modifications, applications and/or combinations of the embodiments may occur to those skilled in the art without departing from the scope of the invention as defined by the claims.

One having ordinary skill in the art will readily understand that the invention as discussed above may be practiced with hardware elements in configurations which are different than those which are disclosed. Therefore, although the invention has been described based upon these preferred embodiments, it would be apparent to those skilled in the art that certain modifications, variations, and alternative constructions would be apparent, while remaining within the scope of the invention.

Although the invention has been described with reference to a preferred embodiment, it will be appreciated by persons skilled in the art that the invention may be embodied in many other forms and numerous variations and/or modifications may be made to the technology as shown in the specific embodiments without departing from the spirit or scope of technology as broadly described. The present embodiments are, therefore, to be considered in all respects as illustrative and not restrictive.

Throughout this specification, unless the context clearly requires otherwise, the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is solely for the purpose of providing a context for the present technology. It is not to be taken as an admission that any or all these matters form part of the prior art base or were common general knowledge in the field relevant to the present technology as it existed before the priority date of each claim of this specification.

What is claimed is:

1. A subchannel detection system for a wireless communication device, the system comprising:
    an input interface configured to receive digital data over a predetermined baseband; the baseband being divided into a plurality of subchannels;
    a plurality of frequency translators, each translator configured to shift spectrum of the digital data within a subchannel to a center of the baseband;
    a plurality of low-pass filters; each low-pass filter configured to filter frequencies within a subchannel bandwidth;
    a plurality of correlators; each correlator configured to receive a filtered digital signal and correlate the received digital signal to a subchannel size; and
    a processing module configured to receive data from the plurality of correlators and detect one or more active subchannels;
    wherein the plurality of frequency translators shift spectrum of all subchannels in the digital data received by the input interface to the center of the baseband; the shifted spectra are filtered by the plurality of low-pass filters and correlated by the plurality of correlators to individual subchannels.

2. The system of claim 1, wherein the baseband spreads between −4 MHz and +4 MHz and the digital data is a digital representation of a modulated analog signal received by a receiving station connected to a wireless network.

3. The system of claim 1, wherein the plurality of subchannels comprises a bandwidth of 1 MHz, 2 MHz, 4 MHz or 8 MHz.

4. The system of claim 1, wherein the plurality of frequency translators comprises frequency translator banks, wherein each frequency translator bank is configured to shift the spectrum of the subchannel with a predetermined bandwidth to the center of the baseband.

5. The system of claim 4, wherein the plurality of frequency translator banks comprises a first bank of eight frequency translators arranged to shift subchannels with a bandwidth of 1 MHz, a second bank of four frequency translators arranged to shift subchannels with a bandwidth of 2 MHz and a third bank of two frequency translators arranged to shift subchannels with a bandwidth of 4 MHz.

6. The system of claim 1, wherein each of the plurality of frequency translators comprises a phase shifter.

7. The system of claim 1, wherein the plurality of low-pass filters comprises a plurality of Finite Input Response Filters (FIRs).

8. The system of claim 7, wherein each subchannel comprises one FIR and each FIR comprises a digital decimator configured to halve a number of samples in the received digital signal.

9. The system of claim 7, wherein the plurality of FIRs comprises minimum phase filters.

10. The system of claim 1, wherein each of the plurality of correlators is configured to correlate the received signal to the subchannel bandwidth.

11. The system of claim 1, wherein the system further comprises a plurality of digital delay modules, each digital delay module being associated with one of the plurality of subchannels and being configured to delay a subchannel signal to synchronize the plurality of subchannels.

12. The system of claim 1, wherein the plurality of frequency translators comprises mixers arranged to multiply incoming sequence of samples by sequences of [1, −1] or [j, −j].

13. The system of claim 1, wherein the plurality of low-pass filters comprises polyphase components $H_e(z^{-2})$ and $z^{-1}H_o(z^{-2})$ where $H_e(z)$ and $H_o(z)$ are even and odd polyphase components of each of the plurality of the low-pass filters.

14. A method for subchannel detection for a wireless communication device embedding a subchannel detection system in accordance with claim 1; the method comprising: receiving digital data over the predetermined frequency baseband at the input interface; the baseband being divided into the plurality of subchannels; shifting the spectrum of the received digital data from a band of the plurality of subchannels to the center of the baseband via one or more of the plurality of frequency translators; filtering frequencies within each subchannel band via the plurality of low-pass filters; correlating each filtered digital signal to a respective subchannel using the plurality of correlators; and detecting the one or more active subchannels by analysing data received from the plurality of correlators via the processing module.

15. The method of claim 14, further comprising: delaying an output of one or more of the plurality of correlators to synchronize the output of each of the plurality of correlators.

16. The method of claim 14, wherein the step of shifting the spectrum of the received digital data further comprises splitting samples of the digital data based on whether each of the samples occupies an even position or an odd position in a sequence of samples and directing samples to different mixers based on whether the samples are odd samples or even samples.

17. The method of claim 14, further comprising: multiplying even samples with [1] or [−1] and odd samples with [j] or [−j].

18. The method of claim 14, wherein the step of filtering frequencies within each subchannel band via the plurality of low-pass filters further comprises using low-pass filters $H_{LP}(z)$ which comprise polyphase components $H_e(z^2)$ and $z^{-1}H_o(z^{-2})$ configured to filter rotated odd and even sequences; wherein He(z) and Ho(z) are even and odd polyphase components of the low pass filter, $H_{LP}(z)$.

19. A wireless local area network (WLAN) station (STA) comprising: an analog receiving module configured to receive a signal encoding modulated data over a predetermined sub-band;
a mixer including a filter configured to shift the received signal to a baseband;
an analog-to-digital converter arranged to convert the signal in the baseband to a digital signal and store the digital signal in a memory;
a subchannel detection system comprising:
an input interface configured to receive digital data over a predetermined baseband;
the baseband being divided into a plurality of subchannels, a plurality of frequency translators, each translator configured to shift spectrum of the digital data within a subchannel to a center of the baseband;
a plurality of low-pass filters; each low-pass filter configured to filter frequencies within a subchannel bandwidth;
a plurality of correlators; each correlator configured to receive a filtered digital signal and correlate the received digital signal to a subchannel size, and a processing module configured to receive data from the plurality of correlators and detect one or more active subchannels,
wherein the plurality of frequency translators shift spectrum of all subchannels in the digital data received by the input interface to the center of the baseband; the shifted spectra are filtered by the plurality of low-pass filters and correlated by the plurality of correlators to individual subchannels; and
a data decoding module arranged to decode the modulated data based on active subchannel information received from the subchannel detection system.

* * * * *